United States Patent
Hahn et al.

(10) Patent No.: US 9,471,723 B2
(45) Date of Patent: Oct. 18, 2016

(54) INPUT PARSING AND ARRAY MANIPULATION IN RESERVOIR SIMULATION

(71) Applicant: Saudi Arabian Oil Company, Dhahran (SA)

(72) Inventors: Werner Artur Hahn, Dharna (SA); Usuf Middya, Dhahran (SA); Henry H. Hoy, Dhahran (SA); Maitham M. Hubail, Qatif (SA)

(73) Assignee: Saudi Arabian Oil Company, Dhahran (SA)

( * ) Notice: Subject to any disclaimer, the term of this patent is extended or adjusted under 35 U.S.C. 154(b) by 765 days.

(21) Appl. No.: 13/790,795

(22) Filed: Mar. 8, 2013

(65) Prior Publication Data
US 2013/0246028 A1    Sep. 19, 2013

Related U.S. Application Data

(60) Provisional application No. 61/611,832, filed on Mar. 16, 2012.

(51) Int. Cl.
*G06F 17/50* (2006.01)
*G06F 9/445* (2006.01)
*G01V 99/00* (2009.01)

(52) U.S. Cl.
CPC ........... *G06F 17/5009* (2013.01); *G06F 17/50* (2013.01); *G01V 99/00* (2013.01); *G06F 9/445* (2013.01)

(58) Field of Classification Search
USPC .................................. 703/2, 22, 24
See application file for complete search history.

(56) References Cited

U.S. PATENT DOCUMENTS

| 2008/0062891 A1* | 3/2008 | Van der Merwe et al. .. 370/254 |
| 2009/0306964 A1 | 12/2009 | Bonnet et al. |
| 2011/0191129 A1* | 8/2011 | Moriya ........................ 705/7.11 |
| 2015/0066369 A1* | 3/2015 | Da Costa Paiva et al. ...... 702/2 |

OTHER PUBLICATIONS

Dogru et al., "A Next-Generation Parallel Reservoir Simulator for Giant Reservoirs", 2009 SPE Reservoir Simulation Symposium, Feb. 2-4, 2009, pp. 1-29, SPE119272.
"Metis Graph Partitioning, Mesh Partitioning, Matrix Reordering", Mar. 2012, http://people.sc.fsu.edu/~jburkardt/c_src/metis/metis.html.

(Continued)

*Primary Examiner* — Thai Phan
(74) *Attorney, Agent, or Firm* — Bracewell LLP; Constance G. Rhebergen; Albert B. Kimball, Jr.

(57) ABSTRACT

A reservoir simulator forms by parallel processing in a multimode computer system estimates of behavior of a subsurface reservoir organized into a matrix grid of three-dimensional cells. The simulator is provided with a module which acts on input data regarding actual reservoir performance and parameters of interest. A grammar is provided which has a sequence of tokens and actions to be taken by the computer system on the input data. Based on the grammar, the input data are arranged into data structures for processing. The module translates the data structures into a set of arithmetic and logical actions to be applied to the original input data provided to the simulator.

21 Claims, 7 Drawing Sheets

(56) References Cited

OTHER PUBLICATIONS

Dogru et al. "A Next-Generation Parallel Reservoir Simulator for Giant Reservoirs" 2009 SPE Reservoir Simulation Symposium in The Woodlands, Texas, SPE 119272, XP007920456, Feb. 2-4, 2009, pp. 1-29.

International Search Report and Written Opinion, PCT/US2013/030426, mailed Apr. 24, 2014.

Oliver et al. "Recent progress on reservoir history matching: a review" Computational Geosciences, vol. 15, No. 1, XP019855726, Jul. 20, 2010, pp. 185-221.

* cited by examiner

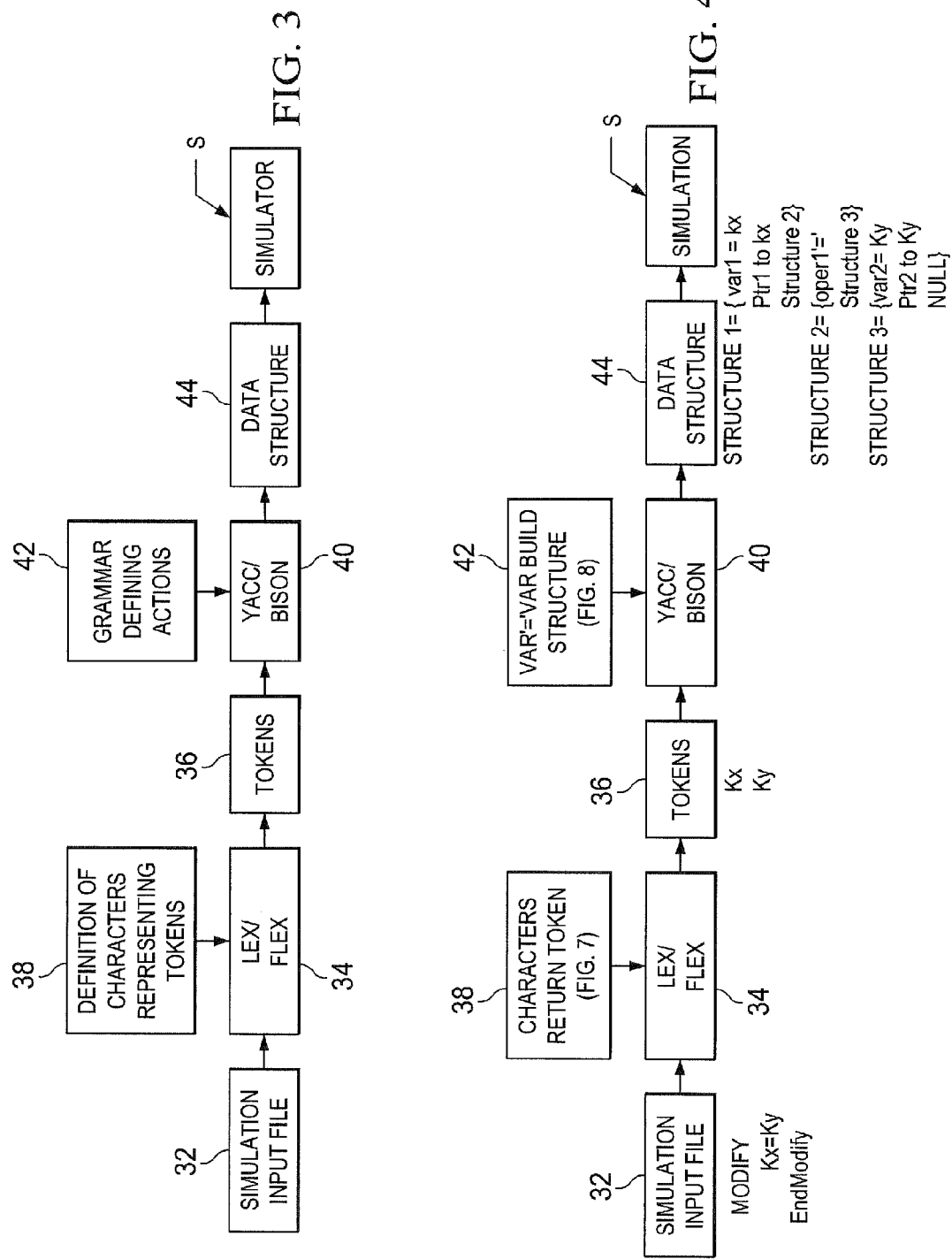

```
function (structure a)
{
        if (structure a has variable)
        {
                find pointer to variable using repository
                /* finds pointer in memory to variable on every compute node*/
        }
        if (structure a has operator)
        {
                if (array is not in NoModifyList)
                {
                        execute code to do operation
                        /* in this example set Kx=Ky */
                }
        }
}
```

INPUT PARSING AND ARRAY MANIPULATION IN RESERVOIR SIMULATION

RELATED APPLICATIONS

This Application claims the benefit of U.S. Provisional Patent Application No. 61/611,832 filed Mar. 16, 2012, entitled "INPUT PARSING AND ARRAY MANIPULATION IN RESERVOIR SIMULATION".

BACKGROUND OF THE INVENTION

1. Field of the Invention

The present invention relates to reservoir simulation by computer processing and more particularly to processing input data from a subsurface reservoir in history matching.

2. Description of the Related Art

In the oil and gas industries, the development of underground hydrocarbon reservoirs often requires the building of computer simulation models. These underground hydrocarbon reservoirs are often complex rock formations which contain both a petroleum fluid mixture and water, with the reservoir fluid content, often existing in two or more fluid phases. The petroleum mixture is produced by wells drilled into and completed in these rock formations.

Reservoir simulation belongs to the general domain of simulation of flow in porous media. However, reservoir simulation normally involves multiple hydrocarbon components and multiple fluid phases in an underground geological formation which is under high pressure and temperature. The chemical phase behavior of these hydrocarbon fluids and the included groundwater has to be taken into account in these simulators.

Sometimes, fluids such as water and/or gases are also injected into these rock formations to improve the recovery of the petroleum fluids. Simulation models therefore contain data which describe several types of information: the specific geometry of the rock formations and the wells, the fluid and rock property data, as well as production and injection history pertaining to the specific reservoirs of the oil or gas field in question.

Oil and gas companies have come to depend on reservoir simulation as an important tool to enhance the ability to exploit a petroleum reserve. Simulation models of reservoirs and oil/gas fields have become increasingly large and complex. The simulator (known in the petroleum industry as a reservoir simulator) which in the past has run these models was a computer operating under the control of a set of computer instructions or software. The software was in coded form, including some specific numerical algorithms and data constructs of an underlying mathematical model. The mathematical model which represented the physics of fluid movements in these hydrocarbon reservoirs was a system of nonlinear partial differential equations which described the transient multiple-phase, multiple-component fluid flow and material balance behaviors in these reservoirs. The fluid flow and material balance changes were induced by the production and/or injection of fluids as well as the pressure-volume-temperature (PVT) relationships of the reservoir fluids.

The reservoir simulator simulated the material balance and fluid flow in underground reservoirs and the included surrounding porous rock formations by subdividing the volume into contiguous cells known as grid blocks. A grid block was the basic finite volume where the mathematical model was applied. The number of grid blocks needed varied depending on the resolution needed for the simulation and the size of the reservoirs and oil and gas fields in question.

An example of a simulator is one known as GigaPowers, which is a parallel oil, water and gas enhanced reservoir simulator for what are known in the industry as giant reservoirs. The GigaPowers simulator solves highly complicated mathematical equations about reservoir parameters based on the physics, chemistry and thermodynamic relation of reservoir structures and their fluid contents. The reservoir is organized into a number of cells or grid blocks. For a giant reservoir, the number of cells can be at least a million or more, and can even reach or exceed a billion, depending on the desired degree of resolution in the simulation model. The initial input data to this reservoir simulator is the state of the reservoir at the beginning of the simulation in addition to injection and production rates of various fluid during time. From this data the simulator computes the state of the reservoir during a sequence of time intervals. The input to the simulator is known as the model.

Periodically it is necessary to perform a procedure known as "history matching" of the model. History matching is a process by which historical data obtained from geologic studies, from interpretation of data obtained from drilled wells, and from production and injection rate measurements in the field are compared with parameter values produced by the simulator. The historical data is provided as inputs to the reservoir simulator. The simulator is then run with the historical data and the output from the simulator is compared with field measurements. If there is a significant discrepancy between simulation results and measured data in the field, the input data to the simulator is adjusted until a reasonable match is obtained. This is known as a modification of the input data.

A history match of an existing oil field that is in production thus initially involves running a computer program called a reservoir simulator with historical data provided by geoscientists and engineers to the simulation personnel. The output from the reservoir simulator, which represents fluid pressures in the field and rates at the different wells, is then compared to the well rates and field pressures measured and recorded during the production history of the reservoir. If there is close agreement between the results of the simulator and the field recorded data, then it is said that the reservoir has been history matched and the current input data, called the model, can be used to predict the behavior of the reservoir in the near future. On the other hand, if the results from the simulator disagree with the values measured in the field, the input data to the simulator needs to be adjusted. This adjustment should ideally be based on the original data with minor modifications. Often considerable time and effort by several different staff members was involved in history matching. Those involved, who are typically reservoir engineers, in history matching needed to modify the model data in order to improve the history match. A full cycle of modifications of the model was required. These modifications could be very sophisticated in nature and the best way to represent them was as algebraic and logical manipulations of the original data.

For a history match of an oil field many simulation runs with different input data were needed. So far as is known, the input data has been changed by modifying previous data in some fashion and rerunning the simulation.

SUMMARY OF THE INVENTION

Briefly, the present invention provides a new and improved computer implemented method of modifying the model for history matching the results of subsurface reservoir simulation with reservoir field production data. The computer implemented method modifies input data regarding the reservoir to more satisfactorily match the reservoir to the field production data based on specified modify instructions regarding simulator input data about the reservoir. The computer implemented method converts the modify instructions into a series of characters known in the industry as tokens, and parses the computer recognizable tokens according to a grammar to form a modify data structure. Next it is determined in the computer if the modify data structure identifies a reservoir variable, and if so, a pointer is found in computer memory to the variable. The present invention also determines in the computer if the modify data structure identifies an operator, and if so, performs the operation according to the identified operator data to modify the simulator input data.

The present invention also provides a new and improved data processing system for history matching the results of computer implemented subsurface reservoir simulation with reservoir field production data to conform the reservoir simulation with the field production data. The data processing system is formed of a plurality of processor nodes and a memory storing reservoir data variables, with each processor node processing data regarding a portion of the reservoir. The data processing system modifies input data regarding the reservoir to more satisfactorily match the reservoir to the field production data based on specified modify instructions regarding simulator input data about the reservoir. The processor nodes convert the modify instructions into a computer recognizable token, and parse the computer recognizable token according to a grammar to form a modify data structure. The processor nodes also determine if the modify data structure identifies a reservoir variable, and if so, finds a pointer in memory to the variable. The processor nodes determine if the modify data structure identifies an operator, and if so, perform the operation according to the identified operator data to modify the simulator input data.

The present invention also provides a new and improved data storage device having stored in a computer readable medium computer operable instructions for causing a data processing system in history matching the results of computer implemented reservoir simulation with field production data from the reservoir. The data processing system modifies input data regarding the reservoir to more satisfactorily match the reservoir to the field production data based on specified modify instructions regarding simulator input data about the reservoir. The data storage device contains instructions causing the data processing system to convert the modify instructions into a computer recognizable token, and parse the computer recognizable token according to a grammar to form a modify data structure. The stored instructions also cause the data processing system to determine if the modify data structure identifies a reservoir variable, and if so, to find a pointer in computer memory to the variable. The stored instructions also cause the data processing system to determining in the computer if the modify data structure identifies an operator, and if so, to perform the operation according to the identified operator data to modify the simulator input data.

BRIEF DESCRIPTION OF THE DRAWINGS

FIG. 3 is a functional block diagram of a set of data processing steps performed in a data processing system for history matching of a reservoir simulator according to the present invention.

FIG. 4 is a more detailed functional block diagram of a set of data processing steps of the history matching of a reservoir simulator according to FIG. 3.

DETAILED DESCRIPTION OF THE PREFERRED EMBODIMENTS

Figure 1:
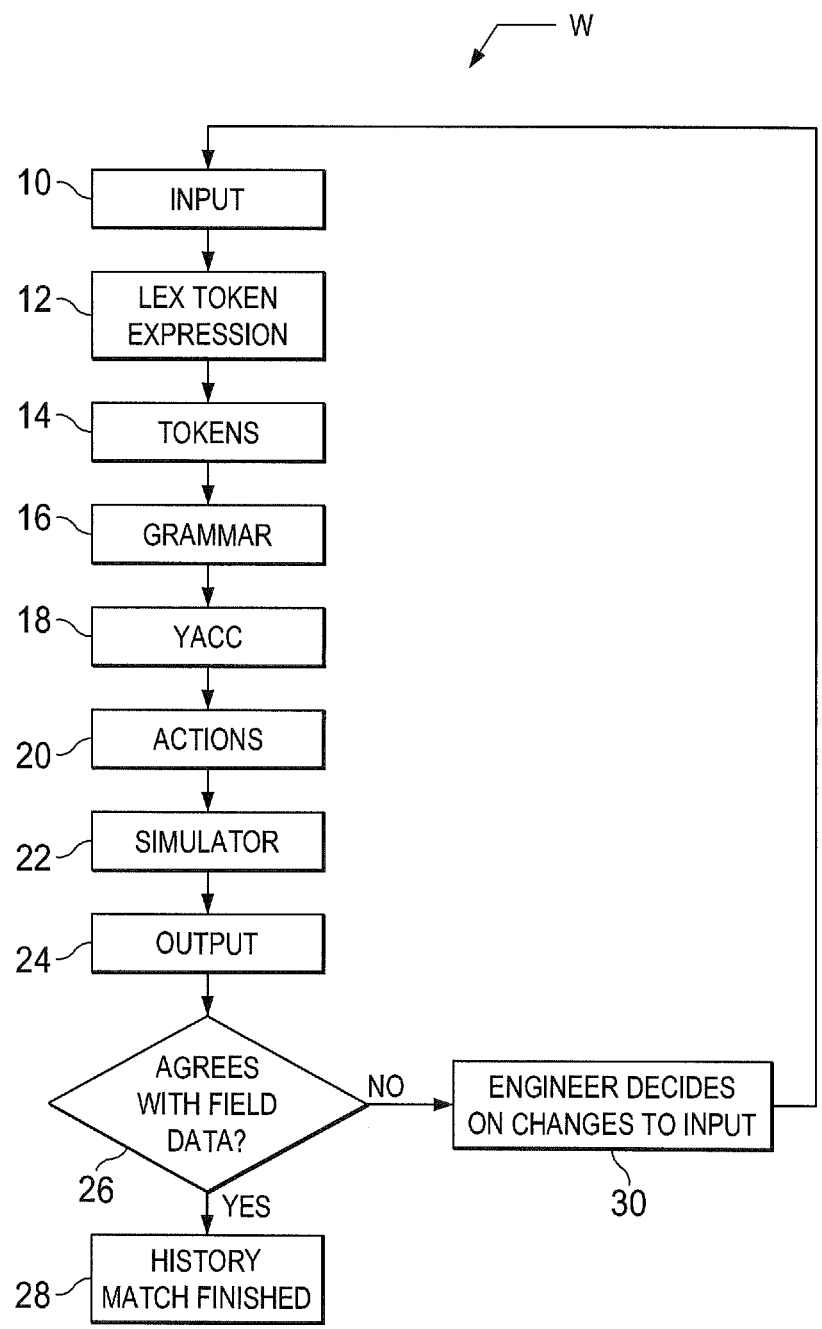
FIG. 1 is a functional block diagram of a set of data processing steps performed in a data processing system for history matching of a reservoir simulator.
Figure 2A:
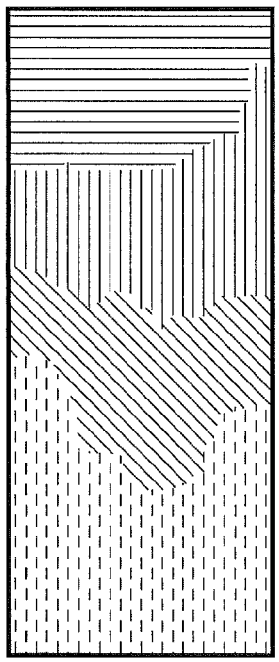
FIGS. 2A, 2B, 2C and 2D are domain partition maps of computation allocation during reservoir simulation among different numbers of processors in a multinode data processing system.
Figure 2B:
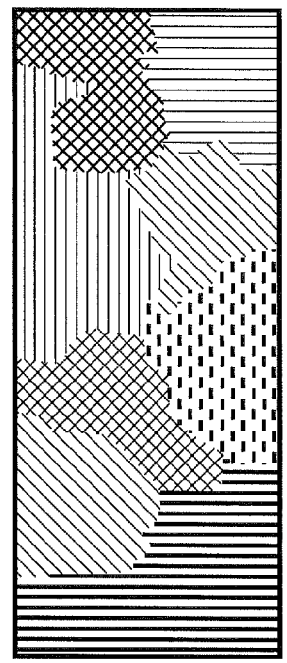
Figure 2C:
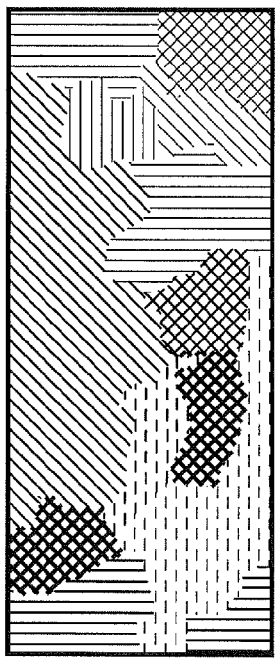
Figure 2D:
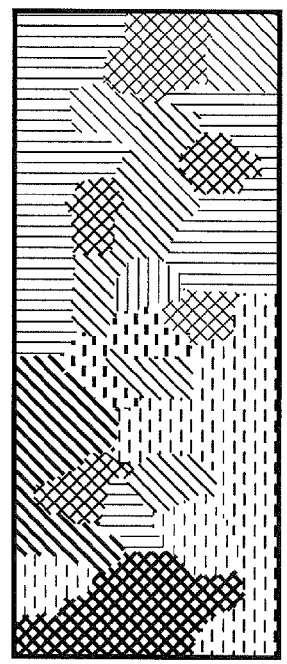

In the drawings, FIG. 1 illustrates schematically by way of background a workflow W of the sequence of processing steps during history matching of a reservoir. During step 10, input historical data representing performance of a hydrocarbon reservoir based on geologic and field measured data is provided to a computer or data processing system. During step 12, a computer development tool or methodology originally known in the art as "lex" and later known as "flex" reads portions of the input data related to manipulation of the original data and separates such input data into character strips referred to as tokens, as indicated schematically at step 14. Next, during step 16, the identified sequences of tokens from step 14 are translated into data structures, resulting as indicated at 16 in what is known as a grammar in information technology.

The resulting tokens after translation into data structures are then furnished as indicated at step 18 to another conventional compiler development tool known as either "yacc" or "bison" for processing. The compiler tool processing during step 18 results in a sequence of computer operational control instructions in a suitable programming language as indicated at step 20, such as C++, which are then furnished to and incorporated into the reservoir simulator as indicated at step 22.

During step 22, the reservoir simulator with its internal sequence modified in the manner set forth above is run with historical data to form an output, as indicated at 24. The output of step 24 from the reservoir simulator is data indicating fluid pressures in the field and rates at the different wells form the reservoir. During step 26, the output from step 24 is compared with field or production measurements in the form of well rates and field pressures measured and recorded during the production history of the reservoir. If the results of step 26 indicate satisfactorily close agreement between the results of step 24 of the simulator and the field recorded data, then the reservoir is considered to have been history matched as indicated at step 28. The simulator then can provide estimates of reservoir performance over times of interest. However, if the simulator output from step 24 and the field production are not within specified limits of acceptable agreement with each other, the input data must be adjusted or modified by reservoir engineers as indicated at step 30. The modifications are performed so that the model is a more accurate representation of nature and can be used to represent predicted or expected production and performance of reservoir being simulated over times of interest during the life of the reservoir.

An example of a simulator is one known as GigaPowers, which is a parallel oil, water and gas enhanced reservoir simulator for what are known in the industry as giant reservoirs. A data processing system D (FIG. 9) according to the present invention incorporates the GigaPowers simulator S, as indicated schematically. The GigaPowers simulator S solves highly complicated mathematical equations about reservoir parameters based on the physics, chemistry and thermodynamic relation of reservoir structures and their fluid contents. The reservoir is organized into a number of cells or grid blocks. For a giant reservoir, the number of cells can be at least a million or more, and can even reach or exceed a billion, depending on the desired degree of resolution in the simulation model.

GigaPowers is a fully unstructured, parallel reservoir simulator. As the simulator is designed to run for very large systems on massively parallel computers, such as that indicated schematically as the data processing system D of FIG. 9, in a highly scalable manner, a great deal of care is taken decomposing the overall problem. The inactive cells, i.e., the cells requiring no computation are squeezed out for efficiency and scalability creating an unstructured data structure even for a structured grid problem. The distribution of the overall reservoir simulation problem has to be carried out at runtime based on the number of computational elements of the data processing system D employed as parallel processors to solve the overall problem.

FIGS. 2A, 2B, 2C and 2D are what are known as domain partition maps. These domain maps show unstructured domains for four representative partitions of reservoir simulation and data for a giant reservoir for an example reservoir simulation problem when the problem is being processed by 4, 8, 16 and 32 parallel processes, respectively. Due to the presence of different distribution of inactive cells in the example reservoir simulation, the resulting domain partitions as illustrated by the shapes in FIGS. 2A through 2D are highly irregular and unstructured, as can be seen. A publicly available set of software known as METIS, for example, is typically used to partition the global reservoir simulation problem into the parallel compute nodes of the data processing system D when operating a simulator for a giant reservoir, such the GigaPowers reservoir simulator.

Any grid array of the reservoir simulation data is partitioned into distributed arrays so that each compute node performing the parallel processing is in effect assigned or owns a particular portion of the grid data. The domain data is stored in a packed format so that the memory use and data access for processing is efficient. This process gives rise to a global and local numbering system.

Figure 10:
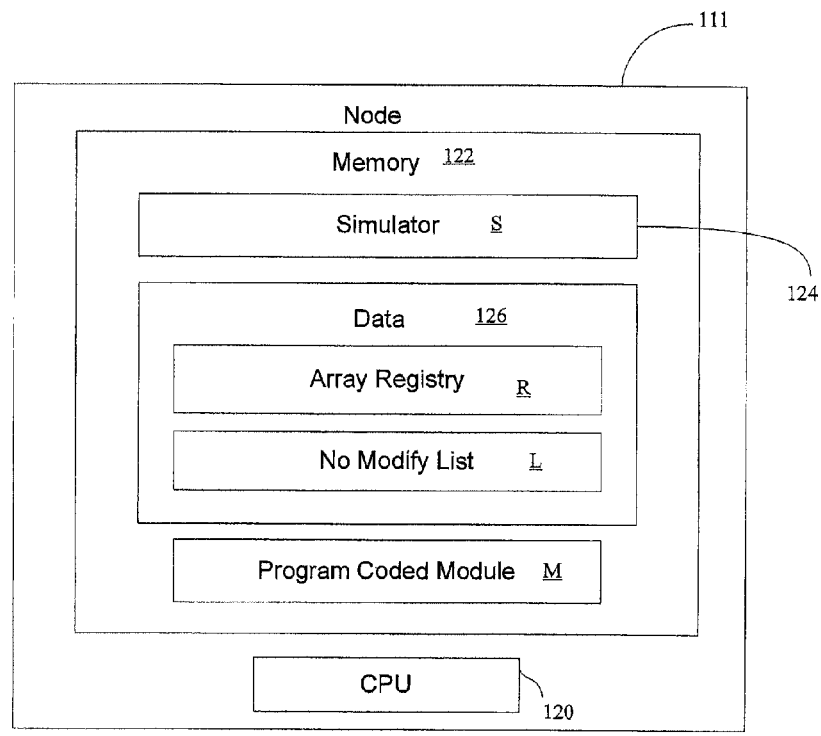
FIG. 10 is a schematic block diagram of a processor node in the data processing system of FIG. 9.

The GigaPowers simulator includes a feature known as an Array Registry, illustrated schematically at R in FIG. 10. The Array Registry R is a repository or storage functionality in which entries or records of the memory storage space used by an array of the data are kept, along with attributes of the data, such as dimension and size, allocated data type, associated class of each array dimension, unit of measurement, and operational status. Each entry in the Array Registry R is referenced by the array name in order to make it easy to retrieve an array record. Functions are built into the GigaPowers simulator system to return the direct memory address of any requested dimensional slice in the array, or the array containing only the filtered data for a specified parameter or attribute, such as porosity level, or if the simulation includes more than one level, e.g. fractures.

The GigaPowers Array Registry R also keeps an indicator on whether the array is a defined GigaPowers simulation array or a user/temporary array, and whether the array has been filled with data read from input or not. In addition, for the case where data regarding a reservoir parameter or attribute, such as porosity level, have been pulled from the original array for modification, there is a function available in the Array Registry R for updating the data back into the original array. These built in functions of the Array Register R help in simplifying the task of retrieving and updating data to and from the original array as stored in computer memory of the data processing system D.

Initially, a record slot is allocated with known GigaPowers simulation arrays during the creation of the registry. Specific array attributes are updated as the arrays are read. User arrays are automatically added to the registry if they are read from a data file, or manually added to the registry using a specialized function call if the array is constructed by user definitions. In addition to the registry there is a No Modify Array list L that contains a list of those variables that a user is not allowed to change at a given stage of the simulation process. The list is built during runtime, and its entries vary depending on the stage of the simulation.

FIG. 3 is a schematic diagram illustrating schematically a general sequence of processing during history matching with the present invention. According to the present invention simulation input data at 32 is furnished as input. The present invention uses a "lex" or "flex" compiler development tool as indicated at 34 which reads the part of the input related to manipulation of the original data and separates this input into known character strings designated as tokens at step 36 based on definitions provided as indicated at step 38.

An important feature of the present invention is the functionality provided as indicated at step 36 as an input to the bison compiler tool for use during step 40. The functionality of bison compiler step 40 is governed by what is known as a grammar at step 42. The grammar of step 42 has unique sequences of tokens, and actions to be taken by the computer when a given sequence of tokens 36 received from flex is identified. The actions of the grammar of step 42 fill a data structure as indicated at 44, preferably in the C++ language as described in the present embodiment.

The separated tokens from step 36 are then used as input to a "yacc" or "bison" compiler development tool at step 40 which produces data structures in the C++ language that are incorporated into the reservoir simulator. Based on determined sequences of tokens provided during step 36, the "bison" compiler development tool during step 40 builds C++ data structures as indicted at 44 which are provided and incorporated to be internal to the reservoir simulator S.

The last element of the data structure is the structure itself. This is the part of the grammar that makes it possible to have unlimited nesting of logical expressions, of IF constructs and parenthesis levels. The data structure is subsequently used by a software module M (FIG. 10). As will be described, actions are taken by the simulator S to change the original simulation data in the way it was specified by the reservoir simulation expert during history matching.

When the software module M, in analyzing the data structure it is provided, finds the structure itself as the last element, module M invokes itself with this just discovered data structure as the new argument. This process permits what is called recursive programming and is a feature of the present invention. The recursive programming permitted according to the present invention allows for arbitrarily deep nesting of logical and arithmetic processes. The data structure also contains the name of the variable to be manipulated. The location in memory of the data arrays are obtained from the Array Registry R. Identification of which grid blocks are present on each compute node is obtained from the procedure shown in FIG. 5.

FIG. 4 illustrates a specific example of the present invention according the general procedure of FIG. 3 described above. Accordingly, the functional steps of FIG. 4 and FIG. 3 use common reference numerals. The simulation input data at 32 in FIG. 4 contains for example a sequence MODIFY, Kx=Ky, END MODIFY indicating certain manipulations to be made to the data of the model. The elements of the sequence are recognized as tokens Kx=Ky at step 38.

Based on the recognized tokens, the following data structures the input line "KX=KY" would send the following tokens and strings to the bison compiler development tool 40:

| Token | String |
|-------|--------|
| VAR   | KX     |
| OPR   | =      |
| VAR   | KY     |

An example grammar from the bison tool at step 40 based on such tokens and strings is then of the form:

```
{VAR OPR VAR    {build Struct type VAR;     /*builds Structl*/
build Struct type OPR;      /*builds Struct2*/
build Struct type VAR;      /*builds Struct3*/}}
```

As shown in FIGS. 3 and 4, the data modification process according to the present invention describes data blocks using the terminology of FIG. 1. Where appropriate, token references to new data blocks in the reservoir simulator data structure are made they are shown in FIG. 4.

The present invention provides a grid data modification system based on a global and local numbering system defining the storage of the grid arrays of the reservoir simulator data for the simulator S. The grid data modification system according to the present invention is preformed by a software module 126 shown in the data processing system of FIG. 9. The software module 126 takes the data structures built by the bison tool during step 40 and translates the data structures into arithmetic and logical actions to be applied to the original input data to the simulator.

The grid data modification system according to the present invention has multiple components. The grid data modification system identifies the operation to be performed by modification to the model data using the global index of the cells affected by the modification process. In the present invention it is preferable to operate on a one dimensional array, i.e. one variable per grid block.

Figures 5, 6:
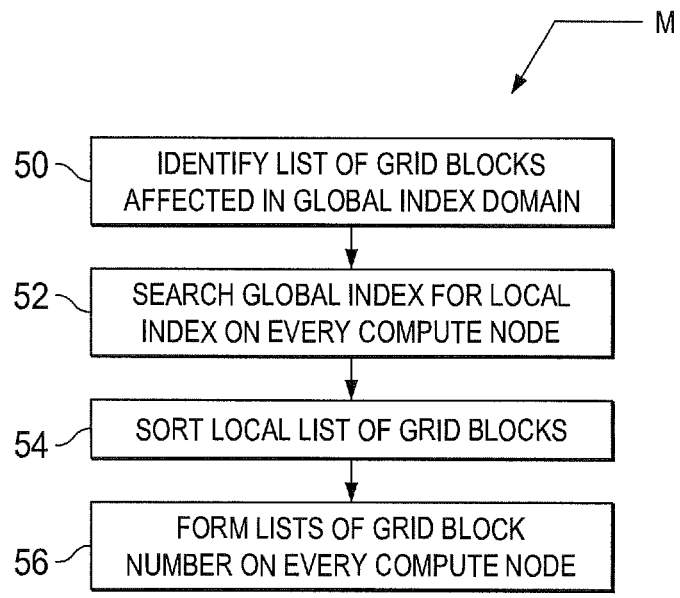
FIG. 5 is a functional block diagram of a module of data processing instructions operating according to the present invention during a portion of the history matching of a reservoir simulator according to FIG. 3.
FIG. 6 is a schematic diagram of processing according to the present invention during a portion of the history matching of a reservoir simulator according to FIG. 3.

User identified global indices of the cells are established during a step 50 of FIG. 5. The global indices may take a number of forms. The simplest form of global index is what can be regarded as a "box" format for structured grid data, by which a user explicitly provides the ranges or extent of the grid in all three directions, in i1, i2, j1, j2, k1, k2 form. In another form, the user can specify a specific slice of three dimensional data in more compact form. In the most general case of fully unstructured grid data, the user is required to provide an explicit, full list of global indices during step 50.

The modification operation by the software module M is carried out in distributed manner on the parallel compute nodes of the data processing system D. The user identified global cell index is transformed into a local cell index on the various compute nodes. This is accomplished as indicated at step 52 of FIG. 5 by searching the global index list maintained on each of the parallel compute nodes to find its local index. The list is generated during the decomposition process performed by a third party program, e.g. METIS as described earlier and maintained as a sorted list for more efficient search.

Each (i, j, k) triplet in global representation of the structured grid is converted into a local index as indicated at step 54 using the same formatting that was used for creating the global index list. The result of the search generally results in non-contiguous local indices. This list is then formed during step 56 and sorted to generate yet another list of grid block numbers on each parallel compute node. The resulting list from step 56 can potentially be one of non-compact, monotonically increasing local cell numbers. In order to increase the efficiency of the modification system, this list is broken or separated into two lists of contiguous lowest and highest indices. The modification process then employs a two level loops structure where the inner loop operates between the lowest and highest index of that sub-loop. This enhances the efficiency greatly by maximizing cache coherence of the grid data thereby reducing memory fetch time.

The simulator S uses the structure resulting from grid data modification to actually perform the data changes indicated by the input line. Each parallel compute node of the data processing system D investigates whether it has part of the affected array in memory. If it is determined that such is the case, the compute node then determines whether or not the affected array is on the No Modify List L for the simulator, and if not it changes the value of the affected array. The third diagram shows a flowchart of the function that does find the affected grid block on each compute node as shown in FIG. 5.

As described in connection with FIGS. 3 and 4, the original input data to the simulator S is data previously read into memory by the simulator. To manipulate this data, two pieces of the simulator S are used. First, there is the Array Registry R which is the simulator logic that is responsible for keeping track of the arrays, specifically the location of the first element of the array in memory. The second, other element of the simulator S that keeps track of which part of the overall grid is on which compute node of the computer, as has been described.

FIG. 6 illustrates an example of processing performed by the simulator S in processing the data structure generated by yacc/bison compiler development tool during step 40 of FIG. 4. The simulator S examines the data structure resulting from compiler tool step 42 as indicated in FIG. 4. If the data structure is found to have a variable, the simulator S finds the pointer to that variable on each of the compute nodes of the data processing system D using the Array Registry R. If the data structure examined by the simulator S is found to be an operator, the simulator then verifies that the array indicated to be the subject of the operator is not on the No Modify List L. The simulator then executes the code to perform the indicated operation. In the context of the example given in FIGS. 4 and 6, the operation is to set Kx=Ky. The pointers to the arrays in data structures 1 and 3 illustrated in FIG. 4 are obtained from the methodology of the present invention described in connection with FIGS. 3 and 4.

Figure 7:
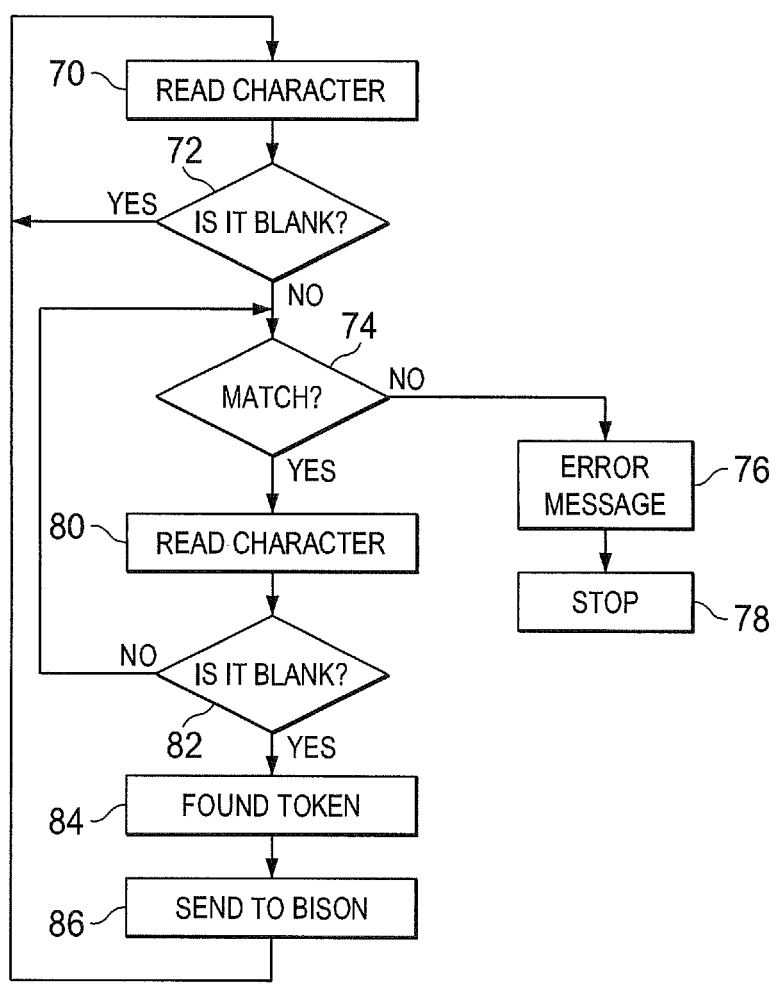
FIG. 7 is a more detailed functional block diagram of a set of data processing steps to identify tokens.
Figure 8:
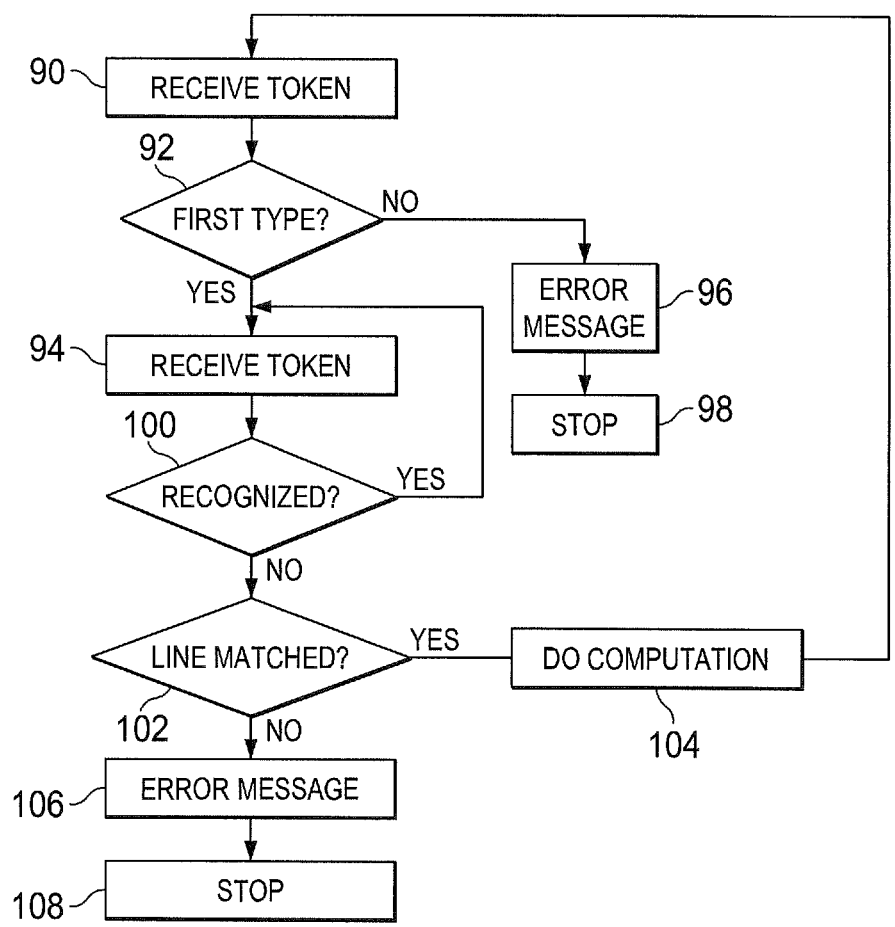
FIG. 8 is a more detailed functional block diagram of a set of data processing steps to interpret the grammar and execute the computation to modify the model data.

FIGS. 7 and 8 depict high level schematics of the logical sequence of lex/flex and yacc/bison processing of the input file and a detailed example of an input line being processed and of the structure being generated by the yacc/bison compiler tool.

As shown in FIG. 7, the flex matching pattern compiler tool P during step 70 reads in a character in the input simulation file stream of data. During step 72, a determination is made whether a character read in is a blank. If so, processing returns to step 70 for another character to be read. If the character read in during step 70 is not blank, step 74 determines whether the character matches any of the definitions provided at step 38. If no match is detected, an error message is sent during step 76 and processing stops as indicated at step 78.

If a match is detected during step 74, step 80 reads the next character and step 82 determines whether the character is blank. If so, step 84 determines it has found a token and the token is made available to bison by step 86. If not, processing continues with step 74 to identify if the character is part of a token string.

An example of definition of character strings for the flex compiler tool processing illustrated in FIG. 7 is of the following form "[a-zA-Z] [a-zA-Z0-9]*"

without the "marks".

The sequence "a-z" is interpreted by the flex compiler tool as meaning any lower case letter between a and z and consecutive sequences between [ ] are interpreted as "or". The symbol "*" is interpreted as "zero or one or more times". So the current example is interpreted by flex as "any lower case letter or any upper case letter, followed by zero or one or more letters or numbers". The expression matches the string A9b but not the string A9$b, because the $ is not part of the definition. Input strings are separated by blanks. Another example is the expression "[=]" that recognizes the = sign by itself. Each of the matched expression causes a different token and the recognized character string to be sent to bison. By way of reference, the tokens are designated as VAR and OPR in this case.

As shown in FIG. 8, the bison compiler tool processing. B during step 90 reads in a received token from step 86 of the flex matching pattern compiler tool P. During step 92, a determination is made whether the token read in is of a specified type. If so, processing proceeds to step 94 where the token is received. If the character read in during step 92 is not of the specified type, step 96 causes an error message to be sent and processing stops as indicated at step 98.

For the tokens during step 94, step 100 determines if the token is part of the grammar If so it returns to step 94 to receive another token. If during step 100 the received token is not recognized, processing moves to step 102 to determine if a data structure line matches the required content and format. If so, processing moves to a step 104 for transfer of the data structure line to the simulator and processing returns to step 90 for receipt of a new token. If a line match is not detected during step 102, step 106 causes an error message to be sent and processing stops as indicated at step 108.

Figure 9:
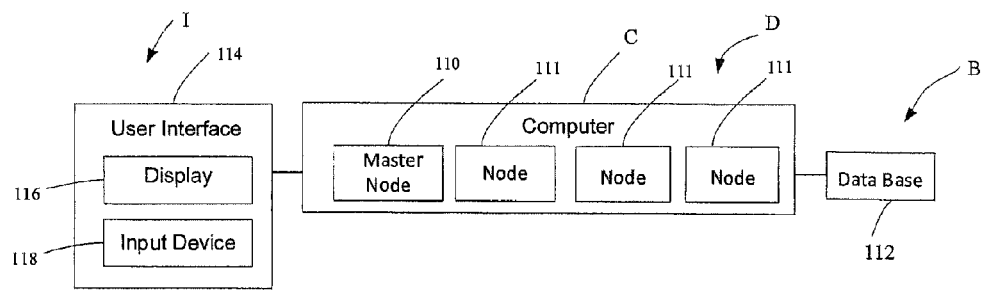
FIG. 9 is a schematic block diagram of a data processing system for modification of the model data.

Considering now the data processing system D on which the present invention is used, it is composed as shown in FIG. 9, of three parts: 1) a computer or compute cluster C that can be any of a number of available computers or cluster on the market, 2) a data base B, and 3) input/output devices I.

The computer C may be comprised of a single CPU or a computer cluster as shown in FIG. 9, including computer memory and other hardware that makes it possible to manipulate data and obtain output data from input data. A cluster is a collection of computers, referred to as nodes, connected via a network. Usually a cluster has one or two headnodes or master nodes 110 that are used to synchronize the activities of the other nodes, referred to as processing nodes 111. The processing nodes 111 all execute the same computer program and work independently on different segments of the grid which logically represents the reservoir.

The data base B is an external device that holds in its memory, a data base 112. The data base contains all the input data, such as water saturations, permeabilities, porosities, and the like. This data is used to construct the input data to the simulator S. Other external devices to the computer I are the input/output devices, such as terminal consoles or graphical displays 116, user input devices 118 and their data storage in the form of hard drives.

The processing nodes 111 (FIG. 10) include a CPU 120 and a data storage memory 122. The CPU 120 performs the arithmetics and logical operations on data in the manner described above. The memory 122 serves as a data storage device which contains stored computer operating instructions in the non-transitory form of program code in the module M, and also the data 126 being manipulated and processed by the CPU 120. The memory 122 also contains the array registry R and the No Modify List L, previously described. It is to be noted that the system D can be any computer that is capable of compiling the computer languages FOTRAN, C and C++, available on the market.

As has been set forth, the grid data modification according to the present invention, with the identified operation to be performed and the index of the cells affected is performed in a cluster computer configuration of processor nodes 111 of the data processing system D. The processor nodes transform the global index coming from the input data to local indices on the processor nodes in two separate lists as has been described.

The processor nodes 111 thus serve as a cluster computer with each of the processor nodes 111 separately, but concurrently with others, performing the data modification specified for the purposes of history matching the simulator to actual reservoir production or performance data. If the data modification causes a satisfactory match of the simulator to actual reservoir data, a history match is achieved. If not, further or different data modifications may be presented and processed in the manner set forth above, and the process repeated.

Another feature of the present invention is the ease of implementation of customized output of calculated arrays. Example 2 below is illustrative regarding this feature. Previously, each time a user needed to look at values that were not carried by internal arrays but could be computed from them, they had to request a simulator code change to compute and output these arrays. This process was tedious, took a long time and was very error prone since it required a complete release cycle of the simulator (change request, implement change, test and debug, release). The present invention permits inclusion of an array output feature through which the user can use a basic MODIFY block to define a custom array based on logical and algebraic combinations of internally carried arrays, and compute them for output at specified time intervals with the simulator S. This can be accomplished without the executable code of the simulator being altered in any way. This feature saves significant amounts of scientist time and associated costs.

The present invention solves problems at two different levels. First, it makes it possible to manipulate original input data to a reservoir simulator in a totally general fashion. It allows for unlimited nesting of logical constructs in the input stream in the portion of the input to the simulator that relates to changes to the original data. It also allows unlimited nesting of parenthesis in arithmetic expressions in the same input and it allows unlimited concatenation of logical arguments to IF statements that may be part of this input. Second, the present invention greatly simplifies the code necessary to handle input to a simulator pertaining to original data manipulation. This simplification of the computer code has several implications. It makes the code written much more robust and much less error prone, it allows much faster development of new features and it improves readability of the code, which is a great help when the code needs to be debugged for some reason.

In history matching of a reservoir according to the present invention, a reservoir model is first obtained in a form as initially described by geoscientists and reservoir engineers. The reservoir simulator S, such as GigaPowers, is then executed with the reservoir model. Output from the simulator is then compared with historical data collected in the field based on production measurements. If the output from simulator does not satisfactorily agree with the historical data, a user then writes MODIFY statements that change the input data to the simulator in order to obtain a closer historical match. A new simulation is then performed with the modified input data, with the MODIFY blocks being processed in the manner set forth above. The process is repeated until the simulation output satisfactorily agrees with historical data from the reservoir. The reservoir can then be regarded as history matched.

EXAMPLE 1

The following is an example of input MODIFY block to the GigaPowers simulator:

```
MODIFY
1 199 1 1188 1 24;
If (TDEPTH ge 4700 and (10 < KX and KX <= 100)) SWC = 0.14;
ENDMODIFY
``` causes the simulator to consider all model grid blocks in the region described by 0<I<200, 0<J<1189, 0<K<25. In this region the values of arrays 1DEPTH and KX are examined. If the value of TDEPTH is greater or equal than 4700, and KX is greater than 10 and KX is less or equal than 100, in a grid block, then the value of array SWC, which represents the reservoir parameter or attribute of connate water saturation, is set equal to 0.14. This type of input was very difficult to express in previous simulators. This form of input required the use of several auxiliary user arrays and was extremely error prone and difficult to read. With the present invention, the input array may be provided in a natural form which an engineer is accustomed to read.

The following example provides two levels of parenthesis in the IF clause and the combination of three logical expressions. Here the intent of this particular construct is to ascertain whether the simulator has honored the user defined input saturation or not.

EXAMPLE 2

```
CUSTOMIZE_ECL_OUTPUT
INIT_ARRAYS
Set_Porosity_Level MATRIX
PCOR: PC_CORRECTION_ARRAY *(0.0000145038);
WOCDPTH4: WOC_DEPTH_4/30.48;
WOCDPTH5: WOC_DEPTH_5/30.48;
WHOLE_GRID;
SW_EXP1 = 2.;
If(DEPTH > WOC_DPEPTH_4 && EQUIL_REGION == 4)
{
SW_EXP1 = 1.;
}
Else
{
SW_EXP1 = 0.;
}
EX_SW_1 : SW_EXP1;
SW_EXP2 = 2.;
If(DEPTH > WOC_DEPTH_5 && EQUIL_REGION == 5)
{
SW_EXP2 = 1.;
}
Else
{
SW_EXP2 = 0.;
}
EXP_SW_2 : SW_EXP2;
PCP = (WOC_DEPTH_5 — DEPTH) * (DENSITY[WATER] — KZ;
PDIFF : PCP;
SDIFF : NEW_SATURATION[WATER] — KZ;
UNRST_ARRAYS
Set_Porosity_Level MATRIX
DENO : DENSITY[OIL] * 62.420;
DENW : DENSITY[WATER] * 62.420;
PCOW : PC[WATER] * (−0.000145038) — PC_CORRECTION_ARRAY
*(0.0000145038);
END_CUSTOMIZE_ECL_OUTPUT
```

This will compute and output another simulator internal array, identified in this case as the J_TO_PC, a simulator internal array of values so that users can be satisfied that the intended computation of this function being performed by the simulator is correct.

The invention has been sufficiently described so that a person with average knowledge in the matter may reproduce and obtain the results mentioned in the invention herein Nonetheless, any skilled person in the field of technique, subject of the invention herein, may carry out modifications not described in the request herein, to apply these modifications to a determined structure, or in the manufacturing process of the same, requires the claimed matter in the following claims; such structures shall be covered within the scope of the invention.

It should be noted and understood that there can be improvements and modifications made of the present invention described in detail above without departing from the spirit or scope of the invention as set forth in the accompanying claims.

What is claimed is:

1. In history matching the results of computer implemented simulation with reservoir field production data from the reservoir to conform the reservoir simulation with the field production data, a computer implemented method to modify input data regarding the reservoir to more satisfactorily match the reservoir to the field production data based on specified modify instructions regarding simulator input data about the reservoir, the computer implemented method comprising the steps of:

converting the modify instructions into a computer recognizable token;
parsing the computer recognizable token according to a grammar to form a modify data structure;
determining in the computer if the modify data structure identifies a reservoir variable, and if so, finding a pointer in computer memory to the variable; and
determining in the computer if the modify data structure identifies an operator, and if so, performing the operation according to the identified operator data to modify the simulator input data.

2. The computer implemented method of claim 1, wherein the modify data structure further identifies an array of reservoir data blocks in the model to be modified, and further including the computer implemented step of:
determining whether the identified array of reservoir data blocks in the model is included in a No Modify List, and if so, inhibiting the step of determining if the modify data structure identifies an operator.

3. The computer implemented method of claim 1, wherein the step of converting the modify instructions into a computer recognizable token is performed with flex matching pattern processing.

4. The computer implemented method of claim 1, wherein the step of parsing the computer recognizable token is performed with bison processing of a grammar.

5. The computer implemented method of claim 1, wherein the reservoir simulation is performed in a cluster computer formed of at least one master node and a plurality of processor nodes, with each processor node processing data regarding a portion of the reservoir, and wherein said step of finding a pointer in memory comprises the step of:
finding a pointer in memory to the variable on the processor nodes.

6. The computer implemented method of claim 5, wherein the modify data structure further identifies an array of reservoir data array in the model to be modified at a global index of the identified array, and further including each identifying the grid blocks in the global index allocated to the processor nodes.

7. The computer implemented method of claim 6, further including the processor nodes each sorting the local index of the identified array of reservoir data blocks allocated to that processor node.

8. The computer implemented method of claim 7, further including the processor nodes each forming a list of the sorted local index of identified array of reservoir data blocks allocated to that processor node.

9. A data processing system for history matching the results of computer implemented subsurface reservoir simulation with reservoir field production data, the data processing system modifying input data regarding the reservoir to more satisfactorily match the reservoir to the field production data based on specified modify instructions regarding simulator input data about the reservoir, the data processing system comprising:
a plurality of processor nodes processing data regarding a portion of the reservoir;
a memory storing reservoir data variables;
each processor node including a processor performing the steps of:
converting the modify instructions into a computer recognizable token;
parsing the computer recognizable token according to a grammar to form a modify data structure;
determining if the modify data structure identifies a reservoir variable, and if so, finding a pointer in the memory to the variable on the processor nodes; and
determining if the modify data structure identifies an operator, and if so, performing the operation according to the identified operator data to modify the simulator input data.

10. The data processing system of claim 9, wherein the modify data structure further identifies an array of reservoir data blocks in the model to be modified, and further including one of the nodes determining whether the identified array of reservoir data blocks in the model is included in a No Modify List; and if so, the processor nodes performing the step of inhibiting the determining if the modify data structure identifies an operator.

11. The data processing system of claim 10, wherein the processor nodes in converting the modify instructions into a computer recognizable token perform with flex matching pattern processing.

12. The data processing system of claim 10 wherein the nodes in parsing the computer recognizable token perform bison processing.

13. The data processing system of claim 10, wherein the modify data structure further identifies an array of reservoir data blocks in the model to be modified and one of the nodes computes a global index of the identified array and further including the processor nodes each identifying the grid blocks in the global index allocated to them.

14. The data processing system of claim 13, the processor nodes each sorting the local of the identified array of reservoir data blocks allocated to that processor node.

15. The data processing system of claim 14, further including the processor nodes each forming a list of the sorted local index of identified array of reservoir data blocks allocated to that processor node.

16. A data storage device having stored in a computer readable medium nontransitory computer operable instructions for causing a data processing system in history matching the results of computer implemented reservoir simulation with field reservoir production data to conform the reservoir simulation with the field production data, the data processing system modifying input data regarding the reservoir to more satisfactorily match the reservoir to the field production data based on specified modify instructions regarding simulator input data about the reservoir, the data storage device containing instructions for causing the data processing system to perform the steps of:
converting the modify instructions into a computer recognizable token;
parsing the computer recognizable token according to a grammar to form a modify data structure;
determining in the computer if the modify data structure identifies a reservoir variable, and if so, finding a pointer in computer memory to the variable; and
determining in the computer if the modify data structure identifies an operator, and if so, performing the operation according to the identified operator data to modify the simulator input data.

17. The data storage device of claim 16, wherein the modify data structure further identifies an array of reservoir data blocks in the model to be modified, and further including instructions causing the data processing system to perform the step of:
determining whether the identified array of reservoir data blocks in the model is included in a No Modify List, and if so, inhibiting the step of determining in the computer if the modify data structure identifies an operator.

18. The data storage device of claim 16, wherein the reservoir simulation is performed in a cluster computer formed of at least one master node and a plurality of processor nodes, with each processor node processing data regarding a portion of the reservoir, and wherein the modify data structure further identifies an array of reservoir data blocks in the model to be modified and each node has a global index of the identified array, and further including the instructions causing the nodes to each identify the grid blocks in the global index allocated to them.

19. The data storage device of claim 16, the reservoir simulation being performed in a cluster computer formed of at least one master node and a plurality of processor nodes, with each processor node processing data regarding a portion of the reservoir, further including instructions causing the processor nodes to each sort the global index for a local index of the identified array of reservoir data blocks allocated to that node.

20. The data storage device of claim 19, further including instructions causing the processor nodes to each sort the local index of identified array of reservoir data blocks allocated to that node.

21. The data storage device of claim 20, further including instructions causing the processor nodes to form a list of the sorted local index of identified array of reservoir data blocks allocated to that node.

* * * * *